(12) United States Patent
Takao

(10) Patent No.: US 8,866,535 B2
(45) Date of Patent: Oct. 21, 2014

(54) SEMICONDUCTOR DEVICE

(71) Applicant: Kabushiki Kaisha Toshiba, Minato-ku (JP)

(72) Inventor: Kazuto Takao, Ibaraki-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/788,257

(22) Filed: Mar. 7, 2013

(65) Prior Publication Data
US 2014/0035656 A1 Feb. 6, 2014

(30) Foreign Application Priority Data
Jul. 31, 2012 (JP) .................................. 2012-170279

(51) Int. Cl.
*H03K 17/687* (2006.01)
*H03K 17/56* (2006.01)
(52) U.S. Cl.
CPC ............ *H03K 17/6871* (2013.01); *H03K 17/56* (2013.01)
USPC .......................................... 327/432; 327/434
(58) Field of Classification Search
None
See application file for complete search history.

(56) References Cited

U.S. PATENT DOCUMENTS

| 3,875,432 | A | * | 4/1975 | Saia | 327/419 |
| 6,023,192 | A | * | 2/2000 | Didier | 330/254 |
| 6,825,722 | B2 | * | 11/2004 | Segawa | 330/254 |
| 7,265,623 | B2 | * | 9/2007 | Bhattacharjee et al. | 330/254 |
| 7,599,754 | B2 | * | 10/2009 | Oohashi et al. | 700/97 |
| 7,649,401 | B2 | * | 1/2010 | Scollo et al. | 327/432 |
| 2004/0189387 | A1 | * | 9/2004 | Okamoto | 330/253 |
| 2006/0091954 | A1 | * | 5/2006 | Darabi | 330/259 |
| 2006/0255872 | A1 | * | 11/2006 | Hino | 331/177 V |
| 2009/0140807 | A1 | * | 6/2009 | Takasoh et al. | 330/252 |

FOREIGN PATENT DOCUMENTS

| JP | 2004-342735 | 12/2004 |
| JP | 2009-278772 A | 11/2009 |

OTHER PUBLICATIONS

Office Action issued Jul. 2, 2014 in Japanese Patent Application No. 2012-170279 (with English language translation).

* cited by examiner

*Primary Examiner* — Cassandra Cox
(74) *Attorney, Agent, or Firm* — Oblon, Spivak, McClelland, Maier & Neustadt, L.L.P.

(57) ABSTRACT

According to one embodiment, a semiconductor device includes: a first switching element; a first interconnection; a first resistor; and a second interconnection. The first switching element includes a first control terminal, a first electrode terminal, and a first conductor terminal. The second switching element includes a second control terminal, a second electrode terminal, and a second conductor terminal. The first interconnection includes a first through a fourth interterminal interconnections. The first resistor is connected at a first end to the first control terminal. The second resistor is connected at a first end to the second control terminal and is connected at a second end to a second end of the first resistor. The second interconnection is provided between the first electrode terminal and the second electrode terminal and/or between the first control terminal and the second control terminal.

15 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2012-170279, filed on Jul. 31, 2012; the entire contents of which are incorporated herein by reference.

FIELD

Embodiments described herein relate generally to a semiconductor device.

BACKGROUND

In semiconductor devices for large current, a configuration in which a plurality of switching elements is connected in parallel is adopted. When bipolar transistors such as an insulated gate bipolar transistor (IGBT) or the like are used as the switching element, a collector electrode is connected to a collector electrode pattern on a circuit board using solder, for example. Also, a gate electrode and an emitter electrode are connected to a gate electrode pattern and an emitter electrode pattern respectively on the circuit board using a bonding wire.

This type of connection relationship is important for further improving the operational stability and reliability.

DETAILED DESCRIPTION

Figure 1:
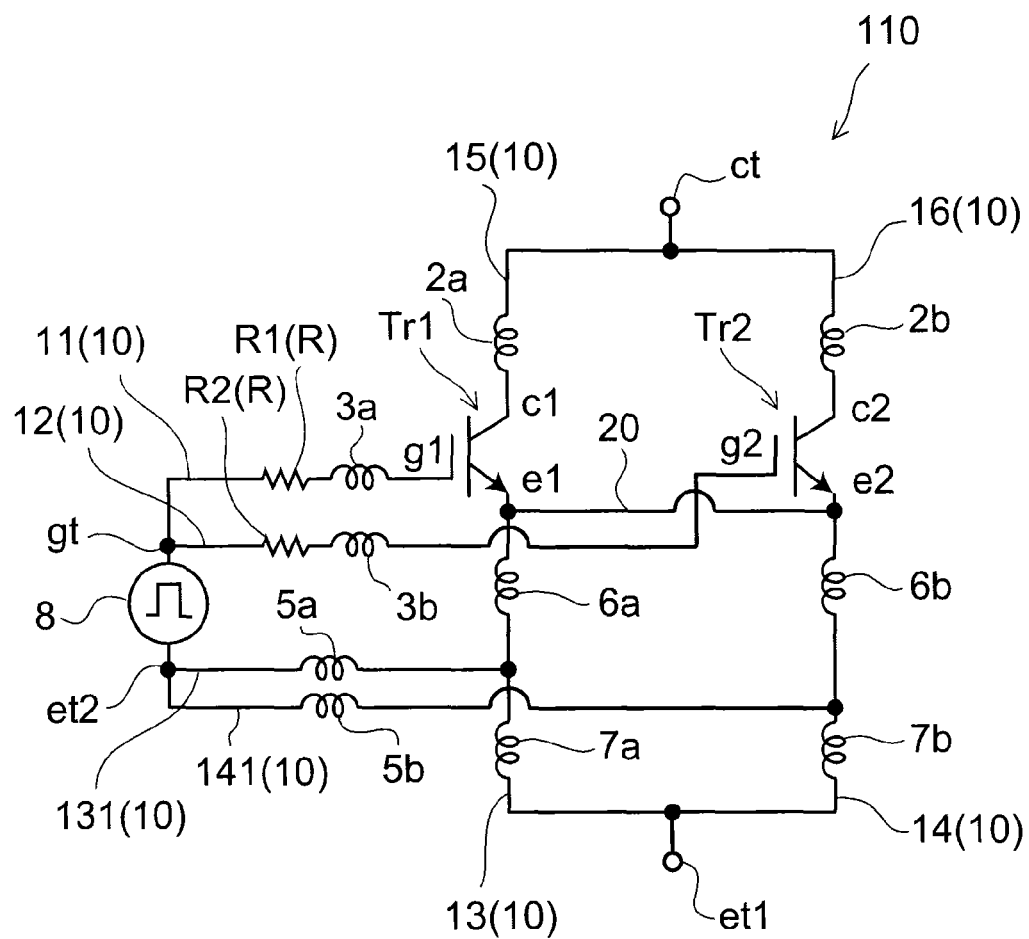
FIG. 1 is a circuit diagram illustrating a configuration of a semiconductor device according to a first embodiment.

In general, according to one embodiment, a semiconductor device includes: a first switching element; a second switching element; a first interconnection; a first resistor; a second resistor; and a second interconnection. The first switching element includes a first control terminal, a first electrode terminal, and a first conductor terminal. The second switching element includes a second control terminal, a second electrode terminal, and a second conductor terminal. The first interconnection includes a first interterminal interconnection that includes a first inductance that is connected at a first end to the first control terminal, a second interterminal interconnection that includes a second inductance that is different from the first inductance and that is connected at a first end to the second control terminal and is connected at a second end to a second end of the first interterminal interconnection, a third interterminal interconnection that includes a third inductance and that is connected at a first end to the first electrode terminal, and a fourth interterminal interconnection that includes a fourth inductance that is different from the third inductance and that is connected at a first end to the second electrode terminal and is connected at a second end to a second end of the third interterminal interconnection. The first resistor is connected at a first end to the first control terminal. The second resistor is connected at a first end to the second control terminal and is connected at a second end to a second end of the first resistor. The second interconnection is provided between the first electrode terminal and the second electrode terminal and/or between the first control terminal and the second control terminal.

Embodiments of the invention will now be described with reference to the drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to constituents that have already appeared in the drawings and have been described, and repetitious detailed descriptions of such constituents are omitted.

(First Embodiment)

FIG. 1 is a circuit diagram illustrating a configuration of a semiconductor device according to a first embodiment.

A semiconductor device 110 according to the first embodiment includes a first switching element Tr1, a second switching element Tr2, a first interconnection 10, a second interconnection 20, a first resistor R1, and a second resistor R2. The semiconductor device 110 is, for example, a so-called power semiconductor module.

An IGBT, for example, is used in the first switching element Tr1 and the second switching element Tr2. A metal oxide semiconductor field effect transistor (MOSFET) may be used in the first switching element Tr1 and the second switching element Tr2 instead of IGBTs. In this embodiment, an example is described for the case that an IGBT is used as the first switching element Tr1 and the second switching element Tr2.

The first switching element Tr1 includes a gate g1 (first control terminal), an emitter e1 (first electrode terminal), and a collector c1 (first conductor terminal).

The second switching element Tr2 includes a gate g2 (second control terminal), an emitter e2 (second electrode terminal), and a collector c2 (second conductor terminal).

The first switching element Tr1 may be configured as a chip that includes a plurality of IGBTs connected in parallel. Likewise, the second switching element Tr2 may be configured as a chip that includes a plurality of IGBTs connected in parallel.

The first interconnection 10 is an interconnection that connects the first switching element Tr1 and the second switching element Tr2 in parallel. The first interconnection 10 includes an interconnection 11 (fourth interconnection) connected to the gate g1, and an interconnection 12 (fifth interconnection) connected to the gate g2 and connected in parallel with the interconnection 11. Also, the first interconnection 10 includes an interconnection 13 (first interterminal interconnection) connected to the emitter e1, and an interconnection 14 (second interterminal interconnection) connected to the emitter e2 and connected in parallel with the interconnection 13. In addition, the first interconnection 10 includes an interconnection 15 (third interterminal interconnection) connected to the collector c1, and an interconnection 16 (fourth interterminal interconnection) connected to the collector c2 and connected in parallel with the interconnection 15.

A first end of the interconnection 11 is connected to the gate g1, and a second end is connected to a second end of the interconnection 12. A first end of the interconnection 12 is connected to the gate g2, and the second end is connected to the second end of the interconnection 11. The second end of the interconnection 11 and the second end of the interconnection 12 are electrically connected to a gate terminal gt. An external gate drive unit 8 is connected to the gate terminal gt. The interconnection 11 includes an inductance 3a, and the interconnection 12 includes an inductance 3b.

A first end of the interconnection 13 is connected to the emitter e1, and a second end is connected to a second end of the interconnection 14. A first end of the interconnection 14 is connected to the emitter e2, and the second end is connected to the second end of the interconnection 13. The second end of the interconnection 13 and the second end of the interconnection 14 are electrically connected to an emitter terminal et1. An interconnection 131 is connected to the middle portion of the interconnection 13. An interconnection 141 is connected to the middle portion of the interconnection 14. The interconnection 131 and the interconnection 141 are electrically connected to an emitter terminal et2. The emitter terminal et2 is connected to the external gate drive unit 8.

The interconnection 13 includes inductances 6a and 7a, and the interconnection 14 includes inductances 6b and 7b. The interconnection 131 includes an inductance 5a, and the interconnection 141 includes an inductance 5b.

A first end of the interconnection 15 is connected to the collector c1, and a second end is connected to a second end of the interconnection 16. A first end of the interconnection 16 is connected to the collector c2, and a second end is connected to the second end of the interconnection 15. The second end of the interconnection 15 and the second end of the interconnection 16 are electrically connected to a collector terminal ct. The interconnection 15 includes an inductance 2a, and the interconnection 16 includes an inductance 2b.

Here, the inductances 3a and 3b include the inherent inductance of the interconnection, and also include the sum of the inherent inductance of the interconnection and the inductance of the first resistor R1 and the second resistor R2 connected to the interconnection. Also, the inductances 5a, 5b, 6a, 6b, 7a, and 7b are the inherent inductances of the interconnection.

The second interconnection 20 is an interconnection that is different from the first interconnection 10. The second interconnection 20 is connected to the emitter e1 of the first switching element Tr1 and the emitter e2 of the second switching element Tr2. The second interconnection is a bypass interconnection between the emitter e1 and the emitter e2.

The first resistor R1 is provided in the middle portion of the interconnection 11 (between the first end and the second end of the interconnection 11). The second resistor R2 is provided in the middle portion of the interconnection 12 (between the first end and the second end of the interconnection 12). The first resistor R1 and the second resistor R2 are elements that control the switching speed of the first switching element Tr1 and the second switching element Tr2. The first Resistor R1 and the second resistor R2 may be a single resistor R. For example, a first end of the single resistor R may be connected to the gate g1 and the gate g2, and a second end of the single resistor R may be connected to the gate terminal gt.

The semiconductor device 110 having the configuration as described above includes a housing 100, for example. The housing 100 houses the first switching element Tr1, the second switching element Tr2, the first interconnection 10, the second interconnection 20, and the resistor R. Also, the gate terminal gt, the emitter terminal et1, the emitter terminal et2, and the collector terminal ct are provided in the housing 100. The semiconductor device 110 is connected to external circuits via the gate terminal gt, the emitter terminal et1, the emitter terminal et2, and the collector terminal ct.

In such a semiconductor device 110, in the device including the first resistor R1 and the second resistor R2, the current (collector current) flowing through the first switching element Tr1 and the second switching element Tr2 is made uniform.

For example, if there is a difference between a value of the inductance 6a of the interconnection 13 and a value of the inductance 6b of the interconnection 14, a difference in the collector currents of the first switching element Tr1 and the second switching element Tr2 is produced. When the second interconnection 20 is provided as in this embodiment, current will flow from whichever one of the first switching element Tr1 and the second switching element Tr2 that has the greater collector current to the one with the less collector current. In this way, the collector current of the first switching element Tr1 and the collector current of the second switching element Tr2 are made uniform.

Specifically, when the inductance 6b of the interconnection 14 connected to the emitter e2 of the second switching element Tr2 is greater than the inductance 6a of the interconnection 13 connected to the emitter e1 of the first switching element Tr1, a part of the collector current of the second switching element Tr2 flows through the interconnection 13 connected to the emitter e1 of the first switching element Tr1 through the second interconnection 20. In this way, the collector currents of the first switching element Tr1 and the second switching element Tr2 are made uniform. The second interconnection 20 serves the function of suppressing variation between the collector currents of the first switching element Tr1 and the second switching element Tr2.

(Second Embodiment)

Figure 2:
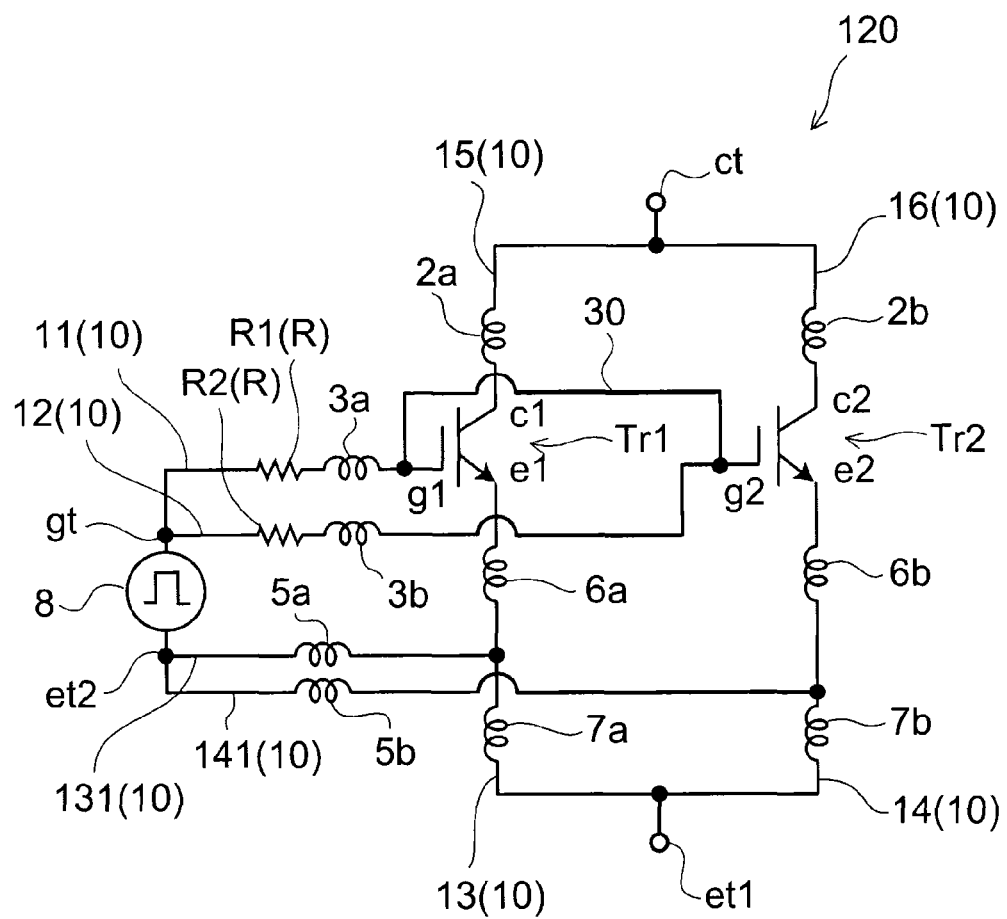
FIG. 2 is a circuit diagram illustrating a configuration of a semiconductor device according to a second embodiment.

FIG. 2 is a circuit diagram illustrating a configuration of a semiconductor device according to a second embodiment.

As illustrated in FIG. 2, a semiconductor device 120 according to the second embodiment differs from the semiconductor device 110 according to the first embodiment as illustrated in FIG. 1 in that the second interconnection 20 is not provided, and a third interconnection 30 is provided.

The third interconnection 30 is an interconnection that is different from the first interconnection 10. The third interconnection 30 is connected to the gate g1 of the first switching element Tr1 and the gate g2 of the second switching element Tr2. A first end of the third interconnection 30 is connected between the first resistor R1 and the gate g1. A second end of the third interconnection 30 is connected between the second resistor R2 and the gate g2. The third interconnection 30 is a bypass interconnection between the gate g1 and the gate g2.

In such a semiconductor device 120, the current (collector current) flowing through the first switching element Tr1 and the second switching element Tr2 is made uniform. In other words, when at least one of the following is produced: (1) a difference between a value of the inductance 3a of the interconnection 11 and a value of the inductance 3b of the interconnection 12, and (2) a difference between a resistance value of the first resistor R1 and a resistance value of the second resistor R2, a difference in gate current is produced between the first switching element Tr1 and the second switching element Tr2.

When the third interconnection 30 is provided as in this embodiment, current will flow from whichever one of the first switching element Tr1 and the second switching element Tr2 that has the greater gate current to the one with the less gate current. In this way, the gate current of the first switching element Tr1 and the second switching element Tr2 are made uniform.

When the gate current of the first switching element Tr1 and the gate current of the second switching element Tr2 are made uniform, the collector currents of the first switching element Tr1 and the second switching element Tr2 are made uniform. The third interconnection 30 suppresses variation between the collector current of elements by making the gate currents of the first switching element Tr1 and the second switching element Tr2 uniform.

(Third Embodiment)

Figure 3:
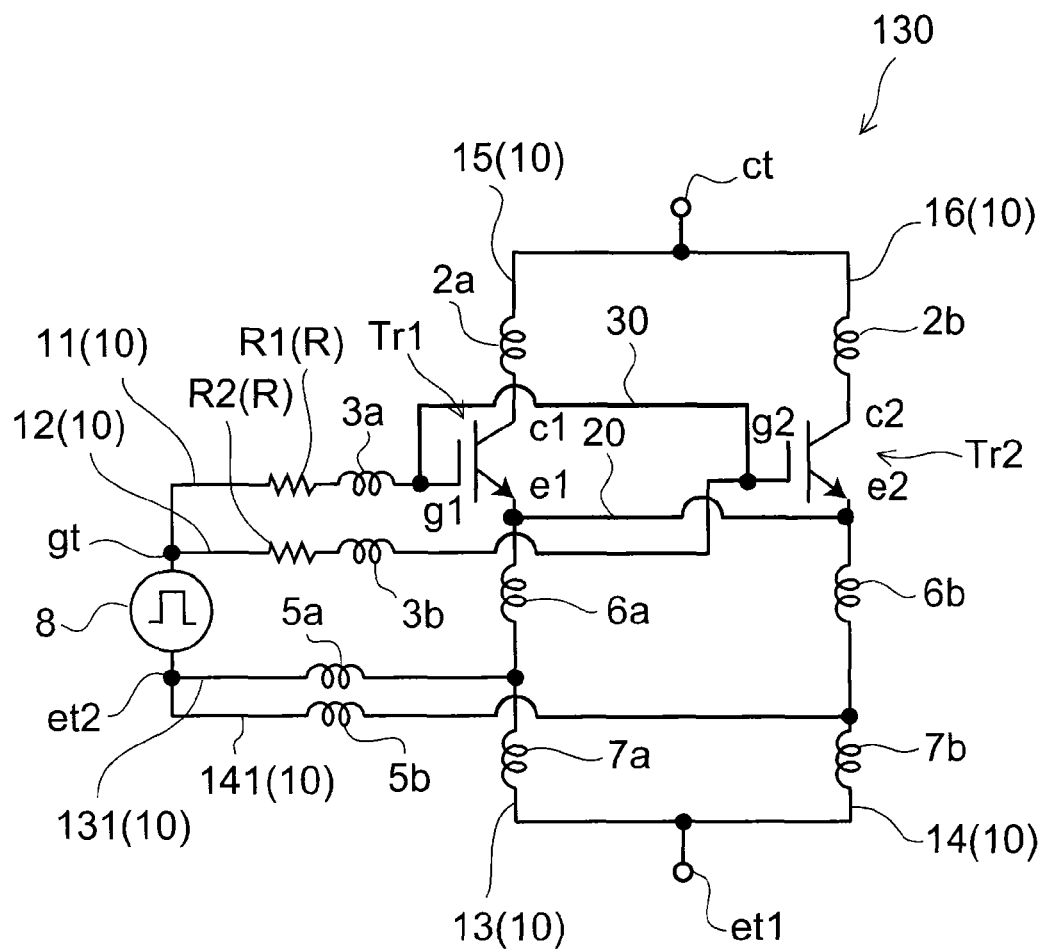
FIG. 3 is a circuit diagram illustrating a configuration of a semiconductor device according to a third embodiment.

FIG. 3 is a circuit diagram illustrating a configuration of a semiconductor device according to a third embodiment.

As illustrated in FIG. 3, a semiconductor device 130 according to the third embodiment differs from the semiconductor device 110 according to the first embodiment as illustrated in FIG. 1 and the semiconductor device 120 according to the second embodiment as illustrated in FIG. 2 in that the second interconnection 20 and the third interconnection 30 are both provided.

In the semiconductor device 130, when there is a difference between a value of the inductance 6a of the interconnection 13 and a value of the inductance 6b of the interconnection 14, the collector current of the first switching element Tr1 and the collector current of the second switching element Tr2 are made uniform via the second interconnection 20. Also, if at least one of (1) and (2) as described above is produced, the gate current of the first switching element Tr1 and the gate current of the second switching element Tr2 are made uniform via the third interconnection 30. The variation between the first switching element Tr1 and the second switching element Tr2 is suppressed by the second interconnection 20 and the third interconnection 30.

Reference Example

Next, a reference example is described.

Figure 4:
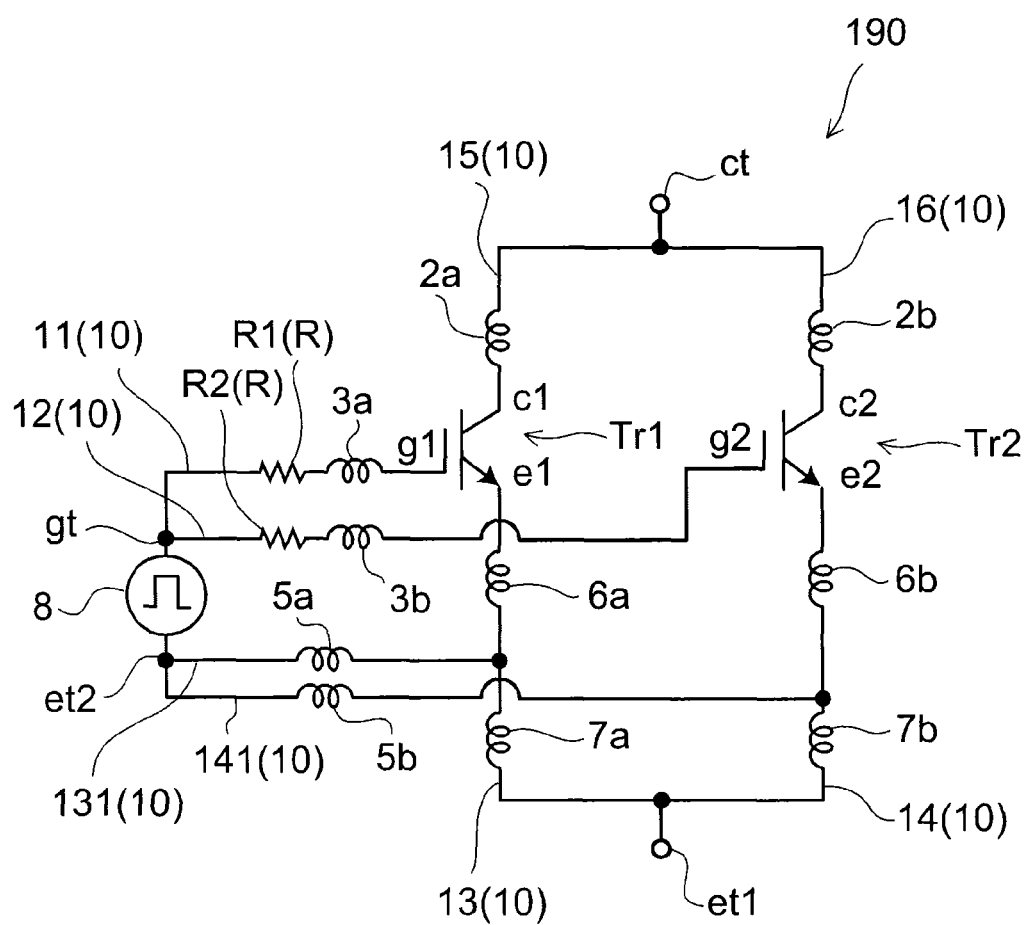
FIG. 4 is a circuit diagram illustrating a configuration of a semiconductor device according to the reference example.

FIG. 4 is a circuit diagram illustrating a configuration of a semiconductor device according to the reference example.

As illustrated in FIG. 4, a semiconductor device 190 according to the reference example includes the first switching element Tr1, the second switching element Tr2, the first interconnection 10, and the resistor R. In other words, the second interconnection 20 and the third interconnection 30 are not provided in the semiconductor device 190.

In the semiconductor device 190, in order to make the switching operation of the first switching element Tr1 and the second switching element Tr2 uniform, it is necessary to make the resistance value of the first resistor R1 and the resistance value of the second resistor R2 uniform, make the inductance 3a of the interconnection 11 and the inductance 3b of the interconnection 12 uniform, and make the inductance 6a of the interconnection 13 and the inductance 6b of the interconnection 14 uniform.

Here, the inductances 6a and 6b are represented as an equivalent circuit of the bonding wire that is included in the interconnections 13 and 14. Both the collector current and the gate current of the first switching element Tr1 and the second switching element Tr2 flow through the inductances 6a and 6b. When the first switching element Tr1 and the second switching element Tr2 are switching, the collector current varies with time, so an induced voltage is produced in the inductances 6a and 6b. This induced voltage is superimposed on the gate-emitter voltage.

If the inductances 6a and 6b are not perfectly equal, a difference is produced between the induced voltages produced in the inductances 6a and 6b. As a result, a difference is produced in the gate-emitter voltage that is applied to the first switching element Tr1 and the second switching element Tr2, so the collector currents of the first switching element Tr1 and the second switching element Tr2 become nonuniform.

Figure 5:
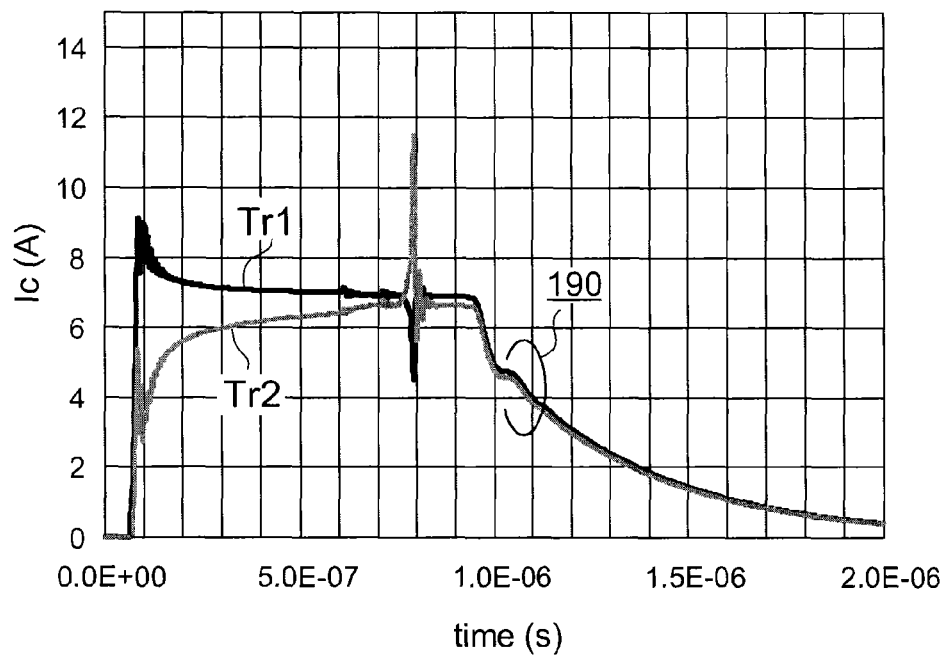
FIG. 5 is a graph showing the variation of a collector current with time.

FIG. 5 is a graph showing the variation of the collector current with time.

The horizontal axis in FIG. 5 is time, and the vertical axis is the collector current. FIG. 5 shows the calculation results for a circuit simulation for the collector current for a case where in the equivalent circuit of the semiconductor device 190 according to the Reference Example, there is a difference between the inductance 3a and the inductance 3b, between the first resistor R1 and the second resistor R2, and between the inductance 6a and the inductance 6b. Normally, in carbon-film resistances or metal-film resistances used in the first resistor R1 and the second resistor R2, there is a tolerance of about ±10%. Corresponding to this, in the circuit simulation, the resistance value of the second resistor R2 was increased by 10% relative to the resistance value of the first resistor R1. The circuit simulation conditions were as follows.

Inductance 3a . . . 5 nano Henry (nH)
Inductance 3b . . . 10 nano Henry (nH)
Resistance value of first resistor R1 . . . 5 Ohms (Ω)
Resistance value of second resistor R2 . . . 5.5 Ohms (Ω)
Inductance 6a . . . 5 nano Henry (nH)
Inductance 6b . . . 7 nano Henry (nH)

As shown in FIG. 5, in the equivalent circuit of the semiconductor device 190, it can be seen that nonuniformity is produced in the collector currents of the first switching element Tr1 and the second switching element Tr2.

When nonuniformity is produced between the collector currents of the first switching element Tr1 and the second switching element Tr2 which are connected in parallel, the amount of heat generated in the switching element in which the greater amount of current is flowing is greater than that of the other switching element. This nonuniformity of the collector currents can cause harm to the stability of operation of the semiconductor device 190.

Figure 6:
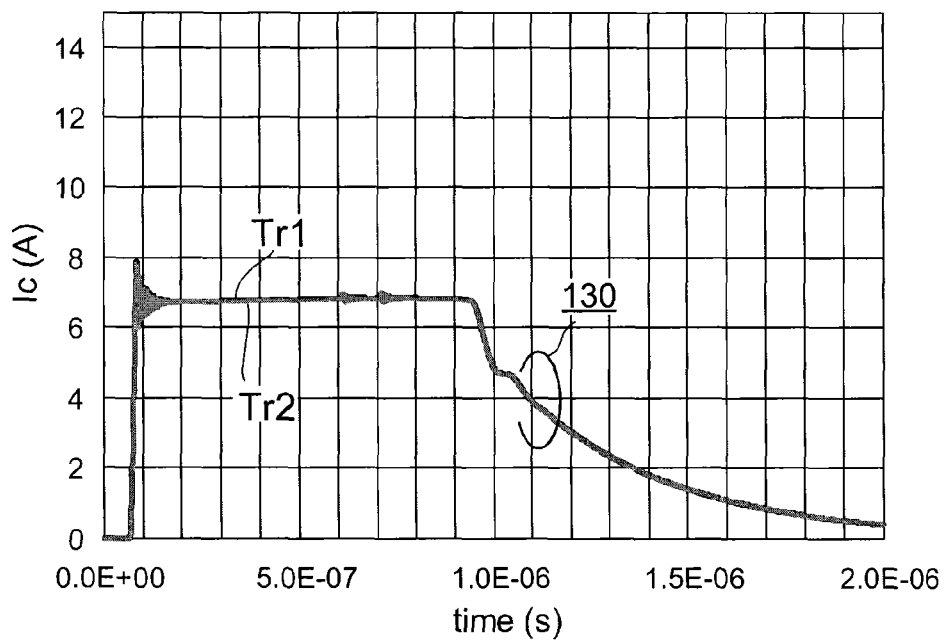
FIG. 6 is a graph showing the variation of the collector current with time.

FIG. 6 is a graph showing the variation of the collector current with time.

The horizontal axis in FIG. 6 is time, and the vertical axis is the collector current. FIG. 6 shows the calculation results for a circuit simulation for the collector current for a case where in the equivalent circuit of the semiconductor device 130 according to the third embodiment, there is a difference between the inductance 3a and the inductance 3b, between the first resistor R1 and the second resistor R2, and between the inductance 6a and the inductance 6b. The circuit simulation conditions were the same as the circuit simulation conditions for the equivalent circuit of the semiconductor device 190 as described above.

As shown in FIG. 6, in the equivalent circuit of the semiconductor device 130, it can be seen that the collector currents of the first switching element Tr1 and the second switching element Tr2 are made uniform.

Next, a layout for each configuration of the semiconductor device is described.

Figure 7:
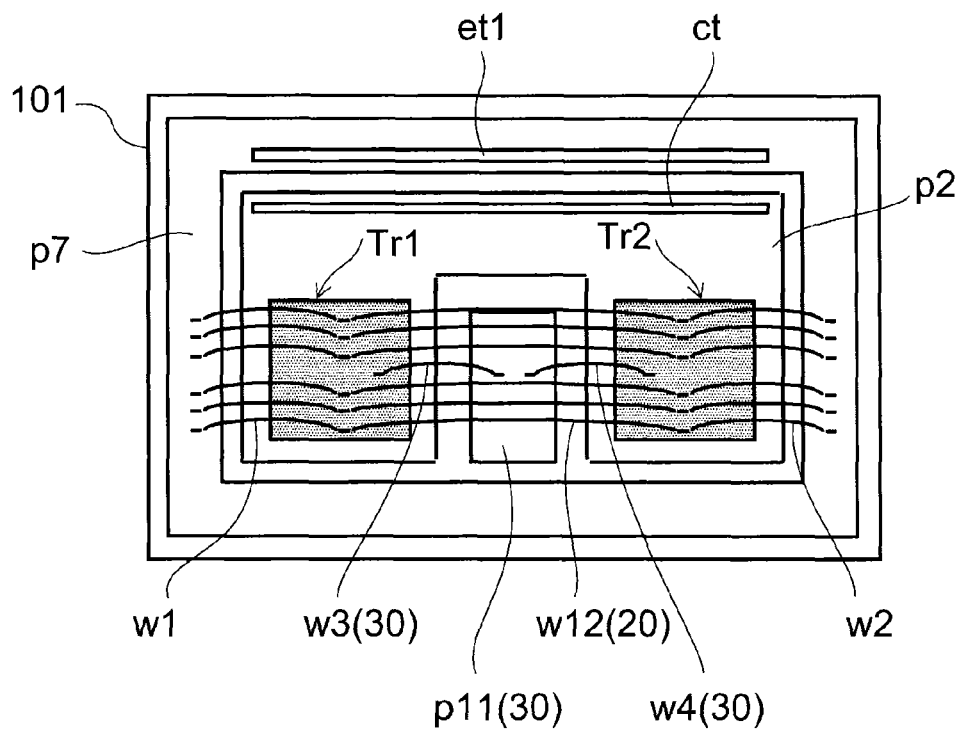
FIG. 7 is a schematic plan view illustrating a first layout.

FIG. 7 is a schematic plan view illustrating a first layout.

As illustrated in FIG. 7, the first switching element Tr1 and the second switching element Tr2 are mounted on a circuit board (first substrate) 101. The collector c1 of the first switching element Tr1 and the collector c2 of the second switching element Tr2 are connected to a collector interconnection pattern p2 on the circuit board 101 by solder or the like.

The emitter e1 of the first switching element Tr1 and the emitter e2 of the second switching element Tr2 are connected to an emitter interconnection pattern p7 on the circuit board 101 by bonding wires w1 and w2. The emitter interconnection pattern p7 is, for example, formed along the periphery of the circuit board 101 so as to surround the outside of the collector interconnection pattern p2.

The gate g1 of the first switching element Tr1 and the gate g2 of the second switching element Tr2 are connected to a gate interconnection pattern p11 on the circuit board 101, by bonding wires w3 and w4. The gate interconnection pattern p11 is disposed between the first switching element Tr1 and the second switching element Tr2. The bonding wires w3, w4 and the gate interconnection pattern p11 correspond to the third interconnection 30. By including the gate interconnection pattern p11 in the third interconnection 30, the inductance is reduced compared with a case where all the components of the third interconnection 30 are bonding wires.

A bonding wire w12 is connected between the emitter e1 of the first switching element Tr1 and the emitter e2 of the second switching element Tr2. The bonding wire w12 corresponds to the second interconnection 20.

In the layout illustrated in FIG. 7, the collector currents of the first switching element Tr1 and the second switching element Tr2 are made uniform by the bonding wire w12 that is provided as the second interconnection 20. Also, the gate currents of the first switching element Tr1 and the second switching element Tr2 are made uniform by the bonding wires w3, w4 and the gate interconnection pattern p11 provided as the third interconnection 30.

Figure 8:
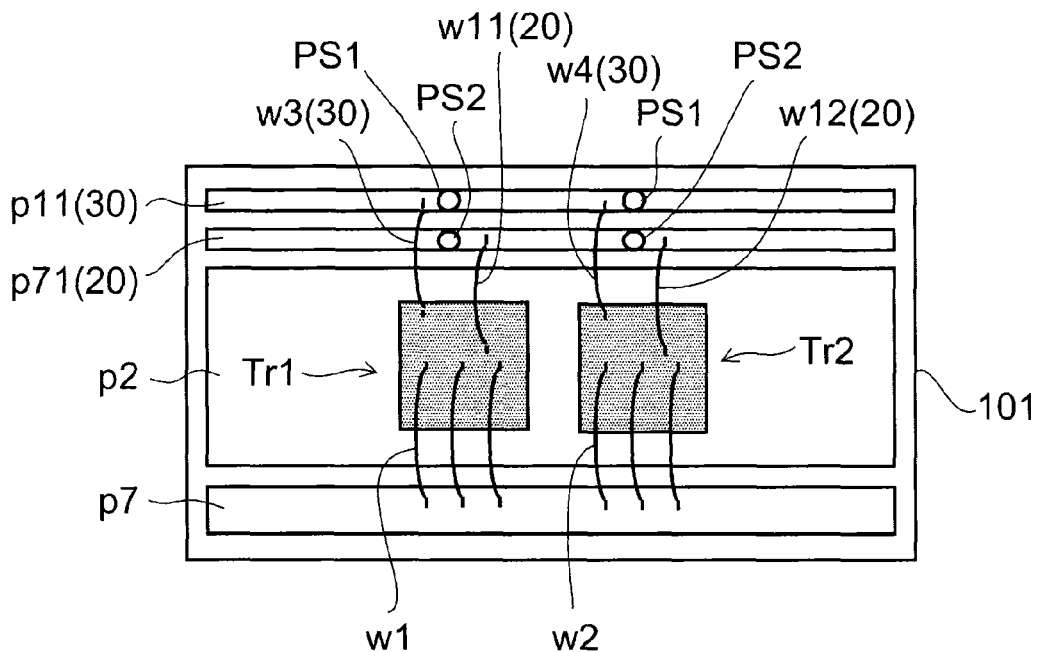
FIG. 8 is a schematic plan view illustrating a second layout.

FIG. 8 is a schematic plan view illustrating a second layout.

As illustrated in FIG. 8, the collector interconnection pattern p2 is provided extending in one direction in the center portion of the circuit board 101. The first switching element Tr1 and the second switching element Tr2 are mounted aligned on the collector interconnection pattern p2. The collector c1 of the first switching element Tr1 and the collector c2 of the second switching element Tr2 are connected to the collector interconnection pattern p2 by solder or the like.

The emitter interconnection pattern p7 is provided extending substantially parallel to the collector interconnection pattern p2 on the circuit board 101. The emitter e1 of the first switching element Tr1 and the emitter e2 of the second switching element Tr2 are connected to the emitter interconnection pattern p7 by the bonding wires w1 and w2.

The gate interconnection pattern p11 is provided extending substantially parallel to the collector interconnection pattern p2 on the circuit board 101. The gate interconnection pattern p11 is provided on the circuit board 101 on the opposite side of the collector interconnection pattern p2 to the emitter interconnection pattern p7. The gate g1 of the first switching element Tr1 and the gate g2 of the second switching element Tr2 are connected to the gate interconnection pattern p11 on the circuit board 101, by the bonding wires w3 and w4. The bonding wires w3, w4 and the gate interconnection pattern p11 correspond to the third interconnection 30. By including the gate interconnection pattern p11 in the third interconnection 30, the inductance is reduced compared with the case where all the components of the third interconnection 30 are bonding wires.

An emitter interconnection pattern p71 is provided extending substantially parallel to the gate interconnection pattern p11 on the circuit board 101. The emitter interconnection pattern p71 is provided on the circuit board 101 between the gate interconnection pattern p11 and the collector interconnection pattern p2. The emitter e1 of the first switching element Tr1 and the emitter e2 of the second switching element Tr2 are connected to the emitter interconnection pattern p71 on the circuit board 101 by bonding wires w11 and w21. The bonding wires w11, w21 and the emitter interconnection pattern p7 correspond to the second interconnection 20.

Posts PS1 and PS2 are provided on the gate interconnection pattern p11 and the emitter interconnection pattern p71, respectively. The posts PS1 and PS2 connect to other substrates or circuits that are not illustrated on the drawings.

In the layout illustrated in FIG. 8, the collector currents of the first switching element Tr1 and the second switching element Tr2 are made uniform by the bonding wires w11, w21 and the emitter interconnection pattern p71 provided as the second interconnection 20. Also, the gate currents of the first switching element Tr1 and the second switching element Tr2 are made uniform by the bonding wires w3, w4 and the gate interconnection pattern p11 provided as the third interconnection 30.

In addition, in the layout as illustrated in FIG. 8, the emitter interconnection pattern p71 is included in the second interconnection 20, so the inductance is reduced compared with the case where all the components of the second interconnection 20 are bonding wires.

Also, in the layout illustrated in FIG. 8, the collector interconnection pattern p2, the emitter interconnection pattern p7, the emitter interconnection pattern p71, and the gate interconnection pattern p11 extend in one direction parallel to each other, so even when many switching elements are mounted, interconnection is simple using bonding wire.

Figure 9:
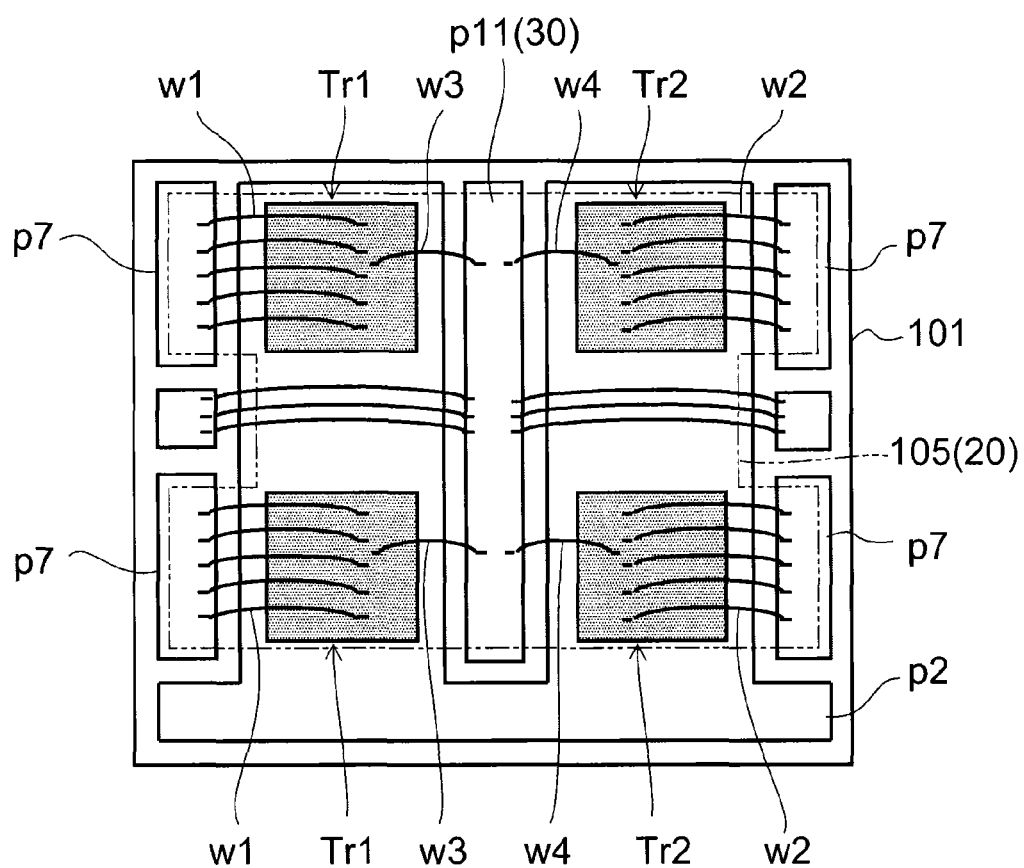
FIG. 9 is a schematic plan view illustrating a third layout.

FIG. 9 is a schematic plan view illustrating a third layout.

As illustrated in FIG. 9, the gate interconnection pattern p11 is provided extending in one direction in the center portion of the circuit board 101. Also, the emitter interconnection pattern p7 is provided in the outside of the circuit board 101. In addition, the collector interconnection pattern p2 is provided in the circuit board 101 between the gate interconnection pattern p11 and the emitter interconnection pattern p7.

In the layout illustrated in FIG. 9, a total of four switching elements are mounted: two first switching elements Tr1 and two second switching elements Tr2. The collectors c1 of the two first switching elements Tr1 and the collectors c2 of the two second switching elements Tr2 are connected to the collector interconnection pattern p2 on the circuit board 101 by solder or the like.

The emitters e1 of the two first switching elements Tr1 and the emitters e2 of the two second switching elements Tr2 are connected to the emitter interconnection pattern p7 on the circuit board 101 by the bonding wires w1, w2.

The gates g1 of the two first switching elements Tr1 and the gates g2 of the two second switching elements Tr2 are connected to the gate interconnection pattern p11 of the circuit board 101 by the bonding wires w3, w4. The bonding wires w3, w4 and the gate interconnection pattern p11 correspond to the third interconnection 30.

In the layout illustrated in FIG. 9, a conductive member 105 is provided on the circuit board 101. The conductive member 105 is a metal plate processed to a predetermined shape. The conductive member 105 is electrically connected to a plurality of emitter interconnection patterns p7 provided in the circuit board 101. For example, a post which is not illustrated on the drawings is provided on each of the plurality of emitter interconnection patterns p7, and the conductive member 105 is provided above the circuit board 101 with the posts disposed therebetween. The conductive member 105 corresponds to the second interconnection 20.

In the layout illustrated in FIG. 9, the collector currents of the first switching element Tr1 and the second switching element Tr2 are made uniform by the conductive member 105 provided as the second interconnection 20. Also, the gate currents of the first switching element Tr1 and the second switching element Tr2 are made uniform by the bonding wires w3, w4 and the gate interconnection pattern p11 provided as the third interconnection 30. Also, by using the conductive member 105 as the second interconnection 20, the inductance is reduced compared with the case in which bonding wire is included in the second interconnection 20.

Next, a semiconductor device including the housing is described.

Figure 10:
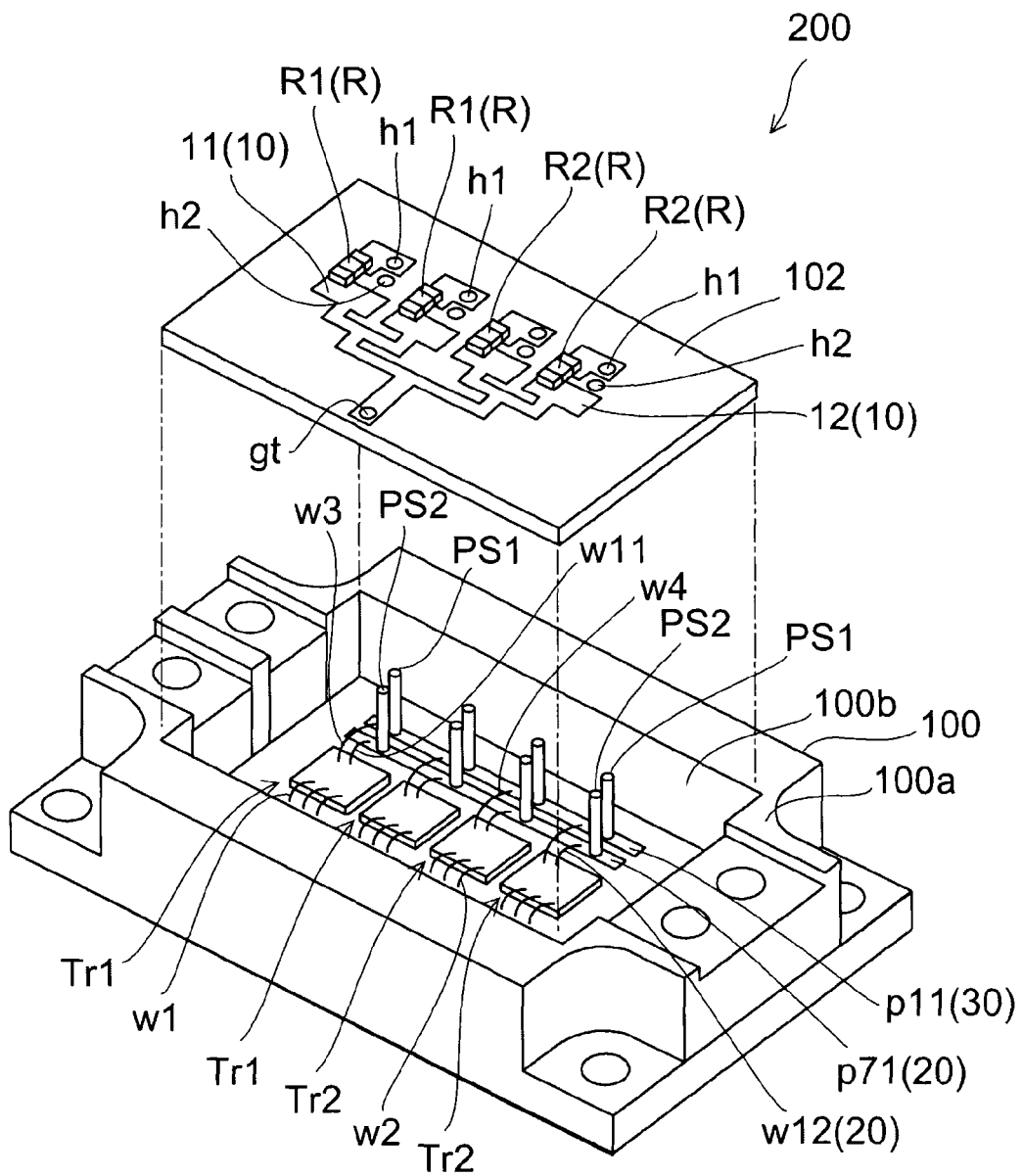
FIG. 10 is a schematic perspective view illustrating a semiconductor device including the housing.

FIG. 10 is a schematic perspective view illustrating a semiconductor device including the housing.

FIG. 10 schematically illustrates a partially exploded view of a semiconductor device 200 including the housing 100.

As illustrated in FIG. 10, the semiconductor device 200 includes the housing 100. The housing 100 is a box having an edge portion 100a, and having an aperture 100b on the top side thereof. The circuit board 101 is housed inside the housing 100. The first switching element Tr1 and the second switching element Tr2 are mounted on the circuit board 101. In the semiconductor device 200 illustrated in FIG. 10, the circuit board 101 with the layout illustrated in FIG. 8 is housed within the housing 100.

A second substrate 102 is disposed above the circuit board 101. The second substrate 102 is disposed on the top side of the circuit board 101 closing the aperture 100b of the housing 100. A portion of the first interconnection 10 is provided in the second substrate 102. In the example illustrated in FIG. 10, the interconnection 11 and the interconnection 12 of the first interconnection 10 are provided. The interconnection 11 and the interconnection 12 are formed as an interconnection pattern on the second substrate 102.

Also, the first resistor R1 and the second resistor R2 are mounted on the second substrate 102. The first resistor R1 and the second resistor R2 are surface mounted devices (SMD), for example. The first resistor R1 is connected to the middle portion of the interconnection pattern of the first interconnection 11. The second resistor R2 is connected to the middle portion of the interconnection pattern of the second interconnection 12. The first resistor R1 and the second resistor R2 may be variable resistors. With a variable resistor, the resistance value is adjusted (switching speed is adjusted) after the first resistor R1 and the second resistor R2 are mounted.

The second substrate 102 is connected to the circuit board 101 via the posts PS1 and PS2. The post PS1 is connected to the gate interconnection pattern p11 of the circuit board 101. The post PS2 is connected to the emitter interconnection pattern p71 of the circuit board 101. The post PS1 and the post PS2 are provided extending substantially vertically from the gate interconnection pattern p11 and the emitter interconnection pattern p71, respectively.

A hole h1 and a hole h2 are provided in the second substrate 102. The hole h1 is provided in the interconnection pattern of the interconnection 11 and the interconnection pattern of the interconnection 12. The hole h2 is provided at a different position in the interconnection pattern of the interconnection 11 and the interconnection pattern of the interconnection 12.

When the second substrate 102 is disposed so that it closes the aperture 100b of the housing 100, the post PS1 is inserted into the hole h1, and the post PS2 is inserted into the hole h2. The post PS1 that is inserted into the hole h1 is electrically connected to the interconnection pattern of the interconnection 11 and the interconnection pattern of the interconnection 12 by solder or the like.

In the semiconductor device 200, a portion of the first interconnection 10 is provided in the second substrate 102, so the degree of freedom of design of the first interconnection 10 is increased compared with a case in which all the components of the first interconnection 10 are formed in the circuit board 101. For example, by making the configuration of the circuit board 101 side common, and the configuration of the second substrate 102 side (the pattern shape of the first interconnection 10 and the resistance values of the first resistor R1 and the second resistor R2) variable, the specification of the semiconductor device 200 may be changed.

Also, in the semiconductor device 200, the first resistor R1 and the second resistor R2 are mounted on the second substrate 102, so in the single package of the semiconductor device 200, a configuration that includes switching elements and gate resistances is realized.

As described above, according to the semiconductor device of this embodiment, it is possible to improve the operational stability and reliability thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first switching element including a first control terminal, a first electrode terminal, and a first conductor terminal;
a second switching element including a second control terminal, a second electrode terminal, and a second conductor terminal;
a first interconnection including
a first interterminal interconnection including a first inductance, a first end of the first interterminal interconnection being connected to the first electrode terminal,
a second interterminal interconnection including a second inductance different from the first inductance, a first end of the second interterminal interconnection being connected to the second electrode terminal, a second end of the second interterminal interconnection being connected to a second end of the first interterminal interconnection,
a third interterminal interconnection including a third inductance, a first end of the third interterminal interconnection being connected to the first conductor terminal, and
a fourth interterminal interconnection including a fourth inductance different from the third inductance, a first end of the fourth interterminal interconnection being connected to the second conductor terminal, a second end of the fourth interterminal interconnection being connected to a second end of the third interterminal interconnection;
a first resistor, a first end of the first resistor being connected to the first control terminal;
a second resistor, a first end of the second resistor being connected to the second control terminal, a second end of the second resistor being connected to a second end of the first resistor; and
a second interconnection provided at at least one of first position and a second position, the first position being between the first electrode terminal and the second electrode terminal, the second position being between the first control terminal and the second control terminal.

2. The semiconductor device according to claim 1, further comprising a first substrate,
the first switching element and the second switching element being mounted on the first substrate, and
the second interconnection including an interconnection pattern provided on the first substrate.

3. The semiconductor device according to claim 2, further comprising:
a first interconnection pattern provided on the first substrate;
a second interconnection pattern provided on the first substrate; and
a third interconnection pattern provided on the first substrate,
the first interconnection pattern being connected to the first electrode terminal by a first bonding wire and being connected to the second electrode terminal by a second bonding wire,
the second interconnection pattern being connected to the first conductor terminal and the second conductor terminal, and
the third interconnection pattern being connected to the first control terminal by a third bonding wire and being connected to the second control terminal by a fourth bonding wire.

4. The semiconductor device according to claim 3, wherein the first interconnection pattern surrounds the outside of the second interconnection pattern.

5. The semiconductor device according to claim 3, wherein the first interconnection pattern is formed along a periphery of the first substrate.

6. The semiconductor device according to claim 3, wherein
the first interconnection pattern extends in one direction,
the second interconnection pattern is parallel to the first interconnection pattern,
the third interconnection pattern is parallel to the second interconnection pattern, and
the first switching element is juxtaposed with the second switching element in the one direction on the second interconnection pattern.

7. The semiconductor device according to claim 2, further comprising:
a second substrate separated from the first substrate, wherein
a portion of the first interconnection is provided in the second substrate.

8. The semiconductor device according to claim 7, further comprising a housing that houses the first substrate and the second substrate.

9. The semiconductor device according to claim 7, wherein
the first resistor is a variable resistor, and
the second resistor is a variable resistor.

10. The semiconductor device according to claim 1, wherein the second interconnection includes a bonding wire.

11. The semiconductor device according to claim 1, wherein
the first switching element is an IGBT, and
the second switching element is an IGBT.

12. The semiconductor device according to claim 1, wherein
the first switching element includes a plurality of IGBTs connected in parallel, and
the second switching element includes a plurality of IGBTs connected in parallel.

13. The semiconductor device according to claim 1, wherein
the first switching element is a MOSFET, and
the second switching element is a MOSFET.

14. The semiconductor device according to claim 1, wherein
the first switching element includes a plurality of MOSFETs connected in parallel, and
the second switching element includes a plurality of MOSFETs connected in parallel.

15. The semiconductor device according to claim 1, wherein
the first resistor is configured to control a switching speed of the first switching element, and
the second resistor is configured to control a switching speed of the second switching element.

* * * * *